US005576748A

United States Patent [19]
Tamura

[11] Patent Number: 5,576,748
[45] Date of Patent: Nov. 19, 1996

[54] RECORDING HEAD WITH THROUGH-HOLE WIRING CONNECTION WHICH IS DISPOSED WITHIN THE LIQUID CHAMBER

[75] Inventor: Hideo Tamura, Kawasaki, Japan

[73] Assignee: Canon Kabushiki Kaisha, Tokyo, Japan

[21] Appl. No.: 63,683

[22] Filed: May 20, 1993

Related U.S. Application Data

[62] Division of Ser. No. 961,035, Oct. 14, 1992, Pat. No. 5,227,812, which is a continuation of Ser. No. 659,702, Feb. 25, 1991, abandoned.

[30] Foreign Application Priority Data

Feb. 26, 1990 [JP] Japan ............................ 2-42533
Feb. 28, 1990 [JP] Japan ............................ 2-49873

[51] Int. Cl.⁶ ............................................. B41J 2/05
[52] U.S. Cl. ................................... 347/58; 347/64
[58] Field of Search ........................... 347/58, 59, 50, 347/64

[56] References Cited

U.S. PATENT DOCUMENTS

| | | | |
|---|---|---|---|
| 4,313,124 | 1/1982 | Hara | 346/140 R |
| 4,345,262 | 8/1982 | Shirato et al. | 346/140 R |
| 4,458,256 | 7/1984 | Shirato | 347/58 X |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,723,129 | 2/1988 | Endo et al. | 346/1.1 |
| 4,740,796 | 4/1988 | Endo et al. | 346/1.1 |
| 5,045,870 | 9/1991 | Lamey et al. | 346/140 R |
| 5,081,474 | 1/1992 | Shibata et al. | 347/59 |
| 5,157,418 | 10/1992 | Tamura | 347/58 |

FOREIGN PATENT DOCUMENTS

| | | |
|---|---|---|
| 0344809 | 12/1989 | European Pat. Off. . |
| 0352142 | 1/1990 | European Pat. Off. . |
| 0380366 | 8/1990 | European Pat. Off. . |
| 54-056847 | 5/1979 | Japan . |
| 56-019639 | 2/1981 | Japan . |
| 59-123670 | 7/1984 | Japan . |
| 59-138461 | 8/1984 | Japan . |
| 60-071260 | 4/1985 | Japan . |
| 60-180147 | 9/1985 | Japan . |
| 63-224241 | 9/1988 | Japan . |
| 1187949 | 7/1989 | Japan . |
| 1191451 | 8/1989 | Japan . |

Primary Examiner—Joseph W. Hartary
Attorney, Agent, or Firm—Fitzpatrick, Cella, Harper & Scinto

[57] ABSTRACT

A recording device includes a substrate having both an ink discharge portion with openings for discharging ink and a liquid chamber for holding the ink for supply to the openings, and a wiring portion transmits signals to electrothermal converting elements. The wiring portion includes several electroconductive layers, an interlayer insulating layer made of first and second insulating layers, and a protective layer. Some of the layers have through holes, and the through holes are disposed within the liquid chamber. Different electroconductive layers are electrically connected via a through hole formed in the interlayer insulating layer. The through hole size varies so that the hole in a second electroconductive layer is larger than the through hole in a first electroconductive layer.

2 Claims, 14 Drawing Sheets

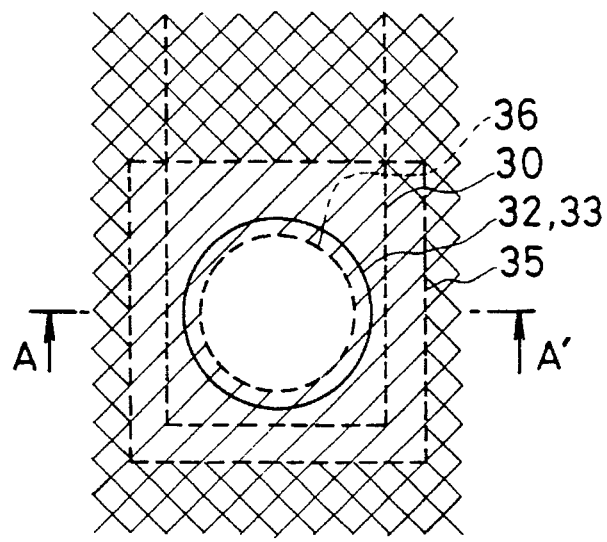
FIG.6
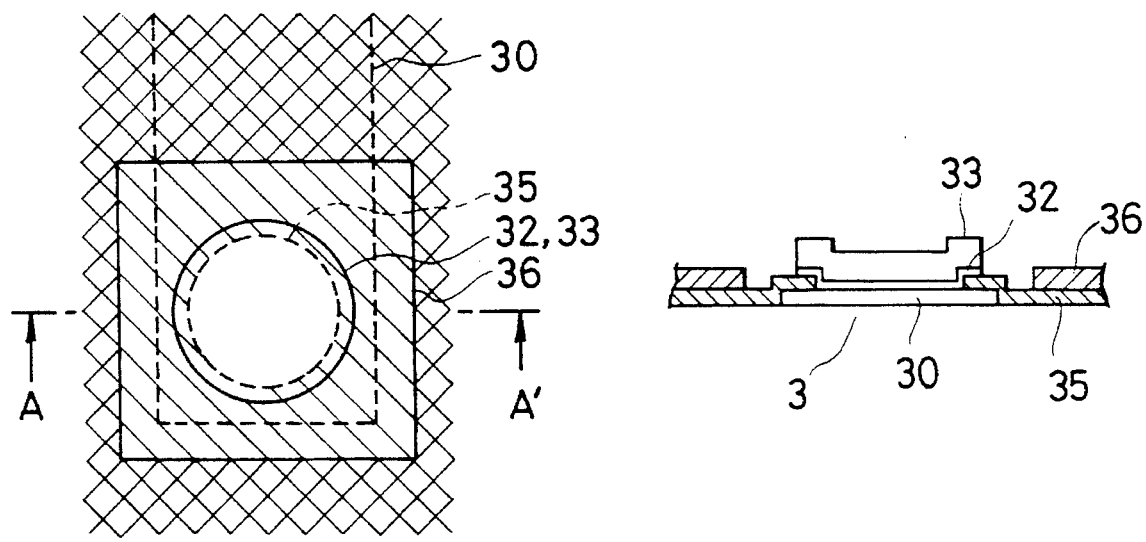
FIG.7B
FIG.7A as a part for liquid such as ink for discharging liquid droplets through orifices of an ink jet recording head to perform recording. Heat generating resistor layers and wiring layers for applying electric power to the heat generating resistor layers are generally formed on the same insulating substrate. Further, protective layers are provided to protect the heat generating resistor layers and the wiring layers from liquid such as ink.

RECORDING HEAD WITH THROUGH-HOLE WIRING CONNECTION WHICH IS DISPOSED WITHIN THE LIQUID CHAMBER

This application is a division of application Ser. No. 07/961,035, filed Oct. 14, 1992 U.S. Pat. No. 5,227,812, which in turn is a continuation of application Ser. No. 07/659,702, filed Feb. 25, 1991 now abandoned.

BACKGROUND OF THE INVENTION

1. Field of the Invention

The present invention relates to a recording system applicable to copying machines, facsimile apparatuses, word processors, printers as an output terminal for a computer or the like, which system performs recording by discharging a recording ink through a discharge portion, a recording head used for the above-described recording system and a wiring substrate suitable for the recording head.

2. Description of the Related Art

Conventionally, full-line type ink jet recording heads having structures as illustrated, for example, in FIG. 1 have been known as a recording head.

In the head 1 illustrated in FIG. 1, an insulated substrate 3 on which there are arranged a plurality of semiconductor devices 2 such as electro-thermal converting elements and their wire bondings and an IC for driving them is placed in a row together with a flexible cable 4 on a support plate 5. The substrate 3 and the cable 4 are pressed onto the support plate 5 by a rigid holding member 6 for holding the flexible cable and five screws 7 through a rubber holder 8 so that a wiring portion of the substrate 3 and the flexible cable 4 can be fixed mechanically and connected electrically to each other. Reference numeral 9 denotes an ink feed pipe for feeding ink from both sides into a common liquid chamber 10. The ink feed pipe is composed of an elastic tube.

A part of the common liquid chamber 10 is formed by providing a member or top plate 11 composed of a resin or the like with depressions, and a part of an ink discharge portion or orifice 12 is similarly formed thereby. By bonding these on the substrate 3 a space for flowing ink therein and openings for discharging ink therethrough are formed, thus constructing the ink jet head 1.

On the other hand, FIG. 2 is a schematic perspective view illustrating a serial scanning type ink jet recording apparatus.

In FIG. 2, the head 1 having, for example, 16 to 256 discharge portions is detachably mounted on a carriage 21 which is guided on a guide shaft 20, and in this state is scanned in a direction perpendicular to the direction in which recording paper 22 is conveyed. Reference numeral 23 denotes a belt conveyor for scanning the carriage 21. Reference numeral 24 denotes a conveyor roll and reference numeral 25 denotes a platen. These convey the recording paper 22 to a desired position. Further, reference numeral 26 denotes a discharge recovering apparatus for maintaining the discharge portions in good condition, which includes an elastic cap, an aspirator and the like.

The system of the above-described example is constructed such that signal outputs for driving the recording paper conveying means, head scanning means and discharge recovering means as well as those for driving the recording head can be controlled by controlling means based on instructions put out from ACPU of the main body of the ink jet recording apparatus.

Among the above-described conventional recording heads and recording systems, what is aimed at by the present invention is an apparatus of a type which discharges ink by utilizing thermal energy since the present invention exhibits excellent effects in this type of apparatus.

The typical structure and operational principle of this type are preferably those disclosed in U.S. Pat. Nos. 4,723,129 and 4,740,796.

On the wiring substrate 3 of the above-described conventional recording head 1 are formed an electro-thermal converting element which generates thermal energy utilized for discharging ink and a wiring portion for connecting the electro-thermal converting element to the semiconductor device 2 such as an IC for driving.

In the wiring portion is provided a bump electrode to be connected to a solder bump provided in the semiconductor device.

Referring to FIGS. 3A to 3E, an example of the structure of the bump electrode in the conventional film wiring substrate will be explained according to its product ion procedures.

Firstly, as shown in FIG. 3A, there are formed on the insulated substrate 3 an Al electrode 30 and also a protective layer 31 composed of an inorganic insulating layer such as a $SiO_2$ or SiN layer or an organic insulating layer such as a polyimide layer and having a circular through hole 31a.

Subsequently, as shown in FIG. 3B, on the substrate 3 are deposited by sputtering a barrier metal layer 32 made of, for example, Cr, Ti, Ni or the like and a solder connecting layer 33 made of, for example, Cu, Au, Cu-Au alloy or the like.

Over the entire surface of the substrate 3 provided with the electrode 30, the protective layer 31, the barrier metal layer 32 and the solder connecting layer 33 is coated a photoresist layer 34 by a spin coating method, a roll coating method, a dipping method, a printing method or the like, and then exposure treatment and development treatment are performed.

Thereafter, as shown FIG. 3D, the solder connecting layer 31 and the metal layer 32 are etched using the photoresist layer 34 as a mask.

Finally, as shown in FIG. 3E, the photoresist layer 34 is peeled off to complete the procedures.

In the production of the above-described conventional film wiring substrate, it is generally the case that a roll coating method is selected in the step of photoresist coating in view of the fact that the substrate is of a polygon (usually tetragon) and has a large area and in view of productivity.

However, in the above-described conventional film wiring substrate, as shown in FIG. 3B, a circular concavity 33a of, for example, several centimeters or more in depth exists in the solder connecting layer 33 above the through hole 31a of the protective layer 31. Thus, it tends to become more difficult at every pitch of a groove of a grooved coating roll (especially, at thread portions of the roll) to carry out coating of the photoresist layer 34, resulting in that there has been a possibility that in a subsequent etching step only the through hole portions of the metal layer (i.e., the solder connecting layer 33 and in addition the barrier metal layer 32) of the concave portion 34a where coating has been carried out incompletely could be etched out.

On the other hand, electro-thermal converting elements in conventional thin film wiring substrates are constructed as follows.

Electro-thermal converting elements have heating units which convert electric energy to thermal energy to be used for discharging ink. As shown in FIGS. 4A and 4B, in order to construct an electro-thermal converting element, at first an $HfB_2$ film 40 serving as a heat generating resistor layer and an Al film serving as an electrode 41 are formed on the substrate plate 3, for example, by sputtering or the like, followed by patterning to form an electro-thermal converting element.

Next, an $SiO_2$ film serving as an antioxidation film 42 and a Ta film serving as anti-cavitation film 43 for the electro-thermal converting element are formed, for example, by sputtering or the like, followed by patterning.

Thereafter, a photosensitive polyimide as an ink-resistant protective film 44 is coated thereon and patterning is carried out.

Further, the second layer, i.e., Al conductive layer 41, is partially exposed and on this exposed portion is formed a common electrode 45 which is Cu-plated. In this case, the $SiO_2$ layer 42 and the photosensitive polyimide layer 44 underlying the common electrode 45 function as an interlayer insulator layer.

Thereafter, a plate 11 having a concave portion for forming a common liquid chamber 10 as a passage for a recording liquid and individual liquid paths 46 is bonded, and a wiring to be connected to a driving circuit which generates driving signals for driving the electro-thermal converting element is electrically connected, thus producing a liquid spray recording head (not shown).

In FIG. 4A, the heat generating resistor layer 40, the electrode 41 and the common electrode 45 are illustrated but the protective layers 42, 43 and 44 and the plate 11 are omitted.

On one end of the electrode 41 opposite to the common electrode, i.e., segment electrode, is usually formed the above-described bump electrode through which the electrode 41 is connected to a semiconductor device. It should be noted that the same is true in the case where the semiconductor device is connected to the end on the side of the common electrode 45.

In the conventional technique as described above, the common electrode 45 is placed outside the plate 11, more specifically outside the liquid paths of the recording head and therefore the part of the electrode 41 on the side of the common electrode 45 must have a length of $M_2$ as shown in FIGS. 4A and 4B which is considerably larger than the length $M_1$ of the part of the electrode 41 within the plate 11 and thus a considerably long high density wiring is necessary. This makes more severe disadvantages involved in production such as low yield due to short circuit, disconnection or the like. That is, repeated driving of the conventional device under application of a large amount of electric current which can generate heat enough to discharge liquid causes short circuit or disconnection, resulting in that the durability of the recording head decreases unacceptably.

SUMMARY OF THE INVENTION

Under the circumstances, the present invention has been made with view to obviating the above-described disadvantages of the prior art.

It is an object of the present invention to provide a recording head comprising a substrate having an ink discharge portion with openings for discharging ink, electro-thermal converting elements for generating thermal energy to change the state of liquid in the ink discharge portion to discharge ink from the openings, and a wiring portion for transmitting signals to the electro-thermal converting elements, the wiring portion including a first electroconductive layer on the substrate, an interlayer insulating layer comprising a first insulating layer of an inorganic material on the first electroconductive layer and a second insulating layer of an organic material on the first insulating layer, and a second electroconductive layer on the interlayer insulating layer and connected electrically to the first electroconductive layer via a through hole in the interlayer insulating layer, the second electroconductive layer being in contact with the first insulating layer in the through hole.

The above and other objects, effects, features and advantages of the present invention will become more apparent from the following description of embodiments thereof taken in conjunction with the accompanying drawings.

BRIEF DESCRIPTION OF THE DRAWINGS

FIG. 6 is a top view of the wiring substrate shown in FIG. 5D;

FIGS. 7A and 7B illustrate the wiring substrate according to another embodiment of the present invention, FIG. 7A showing a top view of the laminated substrate and FIG. 7B being cross section along the line A-A' in FIG. 7A;

DESCRIPTION DESCRIPTION OF PREFERRED EMBODIMENTS

Embodiment 1

Figure 1:
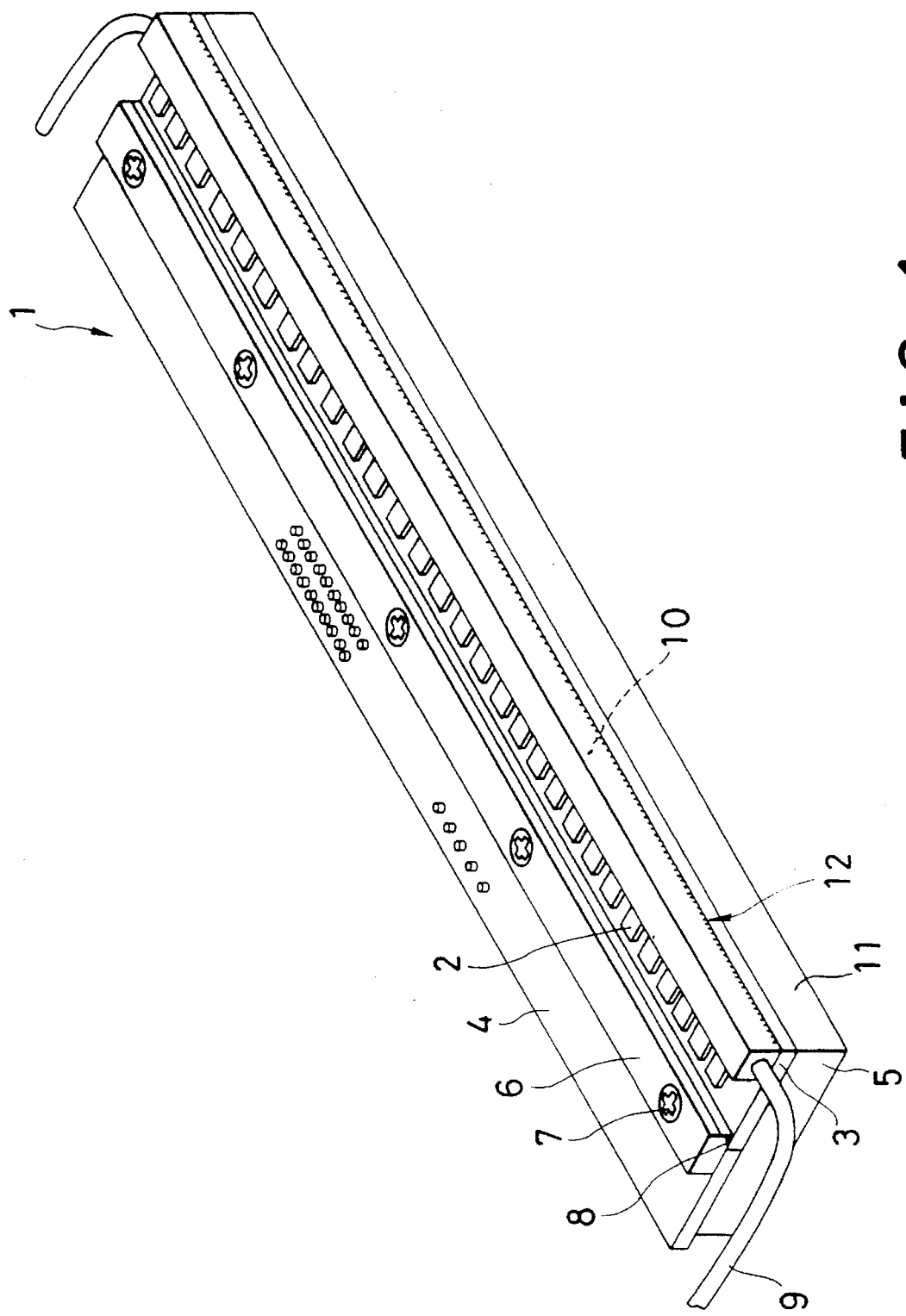
FIG. 1 is a perspective view of the ink jet recording head according to the present invention.

This embodiment relates to a wiring substrate having an improved bump electrode portion.

Hereafter, this embodiment will be explained in detail with reference to the attached drawings. In the drawings, the same components as those shown in FIGS. 3A to 3E are indicated with the same reference numerals as used therein and their explanation are simplified herein.

FIGS. 5A to 5G are intended to illustrate the thin film wiring substrate according to one embodiment of the present invention and are each a cross section showing the production procedure of the bump electrode of the wiring substrate.

Figure 5A:
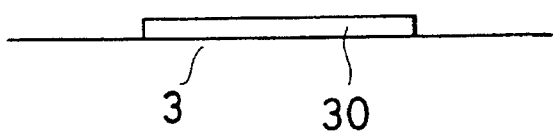
FIGS. 5A to 5G are cross sections of the wiring substrate illustrating the production method for producing the bump electrode according to the present invention.
Figure 5B:
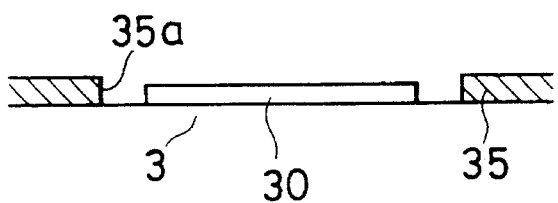
Figure 5C:
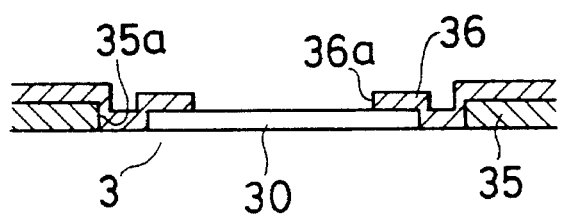

Firstly, as shown in FIG. 5A, the Al electrode 30 is formed on the insulated substrate 3. Thereafter, as shown in FIG. 5B, a protective layer 35 is formed which is provided with a through hole 35a of a tetragonal shape and having a size larger than the outer size of the Al electrode 30. Then, as shown in FIG. 5C, a protective layer 36 is formed. The protective layer 36 is of a circular shape and provided with a through hole 36a having a size smaller than the outer size of the Al electrode 30. On this occasion, the thicknesses of the protective layers 35 and 36 may be enough to protect portions excepting the through hole portion of the Al electrode 30 when they are several micrometers (μm) in total, and the thickness of the protective layer 36 can be made considerably smaller than that of the protective layer 35. therefore, the thickness of the protective layer to be formed on the Al electrode 30 can naturally be made small enough.

Figure 5D:
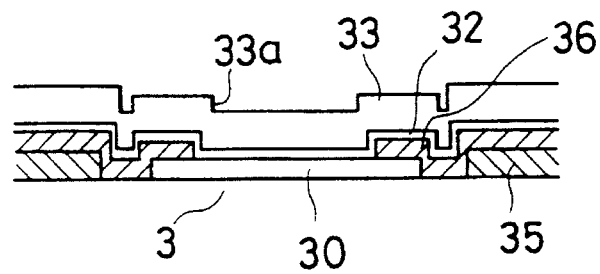
Figure 5E:
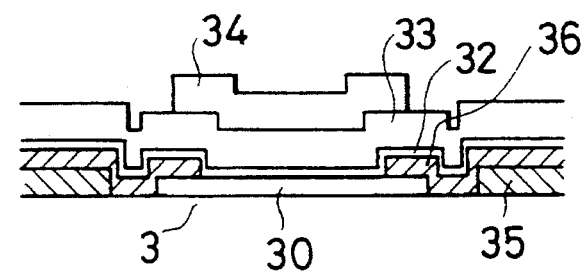

Next, as shown in FIG. 5D, the barrier metal layer 32 and the solder connecting layer 33 are deposited by a known method. Subsequently, as shown in FIG. 5C, the photoresist layer 34 is coated by a roll coating method, exposed to light and developed. Upon coating the photoresist, as shown in FIG. 5D and FIG. 6, the protective layer on the Al electrode 30 can be made formed to a small thickness even when it has a construction such that the thickness of the through hole portion (the thickness of the laminate within the through hole, i.e., the thicknesses of the barrier metal layer 32 + the solder connecting layer 33 + the photoresist layer 34) is the same in total as that of the conventional ones, resulting in that the circular concave portion 33a of the solder connecting layer 33 positioned within the through hole portion where it has hitherto been difficult to coat photoresists can be made extremely small in depth. Therefore, coating performance can be improved greatly by minimizing the difference in height, or depth, of the concave portion 33a of the solder connecting layer 33. Use of the protective layer of a two-layer structure makes it possible to design the shape of through holes freely; through holes may have different shapes one from another. Accordingly, the through hole in the lower layer may be of a shape corresponding to the contour of the electrode and the one in the upper layer may be of a shape suitable for the bump electrode portion. This construction increases the area of the through hole in the upper layer and further the area of the concave portion 33a in the solder connecting layer 33, thus making it possible to increase coating area of the photoresist and solving the problem that coating of photoresist is impossible in the conventional circular through hole portion.

As described above, because the protective layer for the Al electrode is laminated in at least two layers, the number of defects such as pin-holes in the protective layer is negligibly small and it is now unnecessary to increase the thickness of the coating film excessively as has been required in protective layers of a single layer construction conventionally used, resulting in that the film thickness can be made smaller than ever, which decreases cost of materials and prevents curling or other undesirable phenomena of the substrate which could otherwise occur due to lamination of the substrate material with different kinds of materials.

Figure 5F:
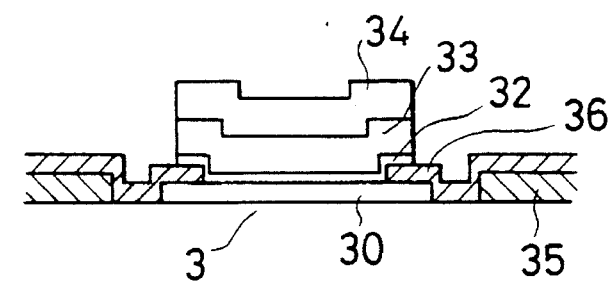
Figure 5G:
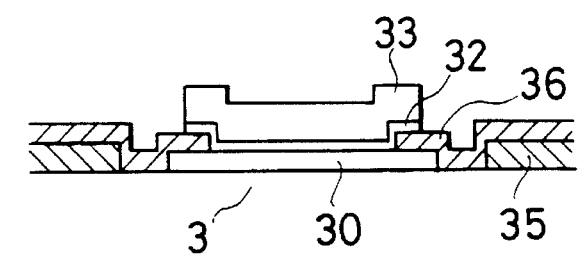
Figure 8:
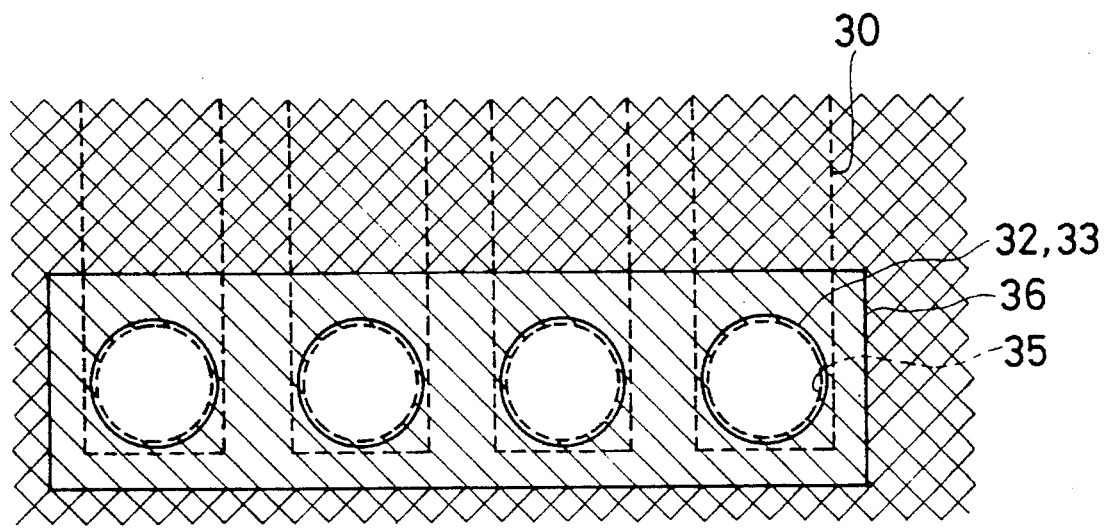
FIG. 8 is a top view of the wiring substrate according to still another embodiment of the present invention.

After the above-described step, as shown in FIG. 5F, etching of the metal layer 32 is carried out, and finally, as shown in FIG. 5G, the photoresist layer 34 is peeled off to complete the procedure.

While in the above description, the through hole in the upper protective layer 36 is made of a circular form and the through hole in the lower protective layer 35 is made of a tetragonal form as shown in FIG. 6, they may be made in reverse relation, that is, the through hole in the protective layer 36 is tetragonal and the through hole in the protective layer 35 is circular as shown in FIGS. 7A and 7B. Further, the tetragonal shape of the through hole may be selected freely; for example, it may be constructed such that one of the protective layers (the protective layer 36) is formed continuously for a plurality of electrodes 30. While in the above description, the through hole in either one of the protective layers 35 and 36 is made of a size larger than the outer size of the Al electrode 30, basically no problem will occur if it has the same size as the outer size of the Al electrode 30. What is important is to make the thickness of the protective layer on the electrode 30 small enough, and for this purpose, the protective layer is made of a multilayer construction, thus maintaining as a whole a film thickness sufficient for protecting the electrode while at least one among plural layers covers the electrode around the periphery of the through hole portion. There is no limitation on the kind of materials for the protective layers 35 and 36 and any type of inorganic or organic insulating film may be used.

Embodiment 2

In the case where the wired electrode substrate 3 according to Embodiment 1 is applied to a substrate for an ink jet recording head, the substrate is constructed as follows.

Figure 9:
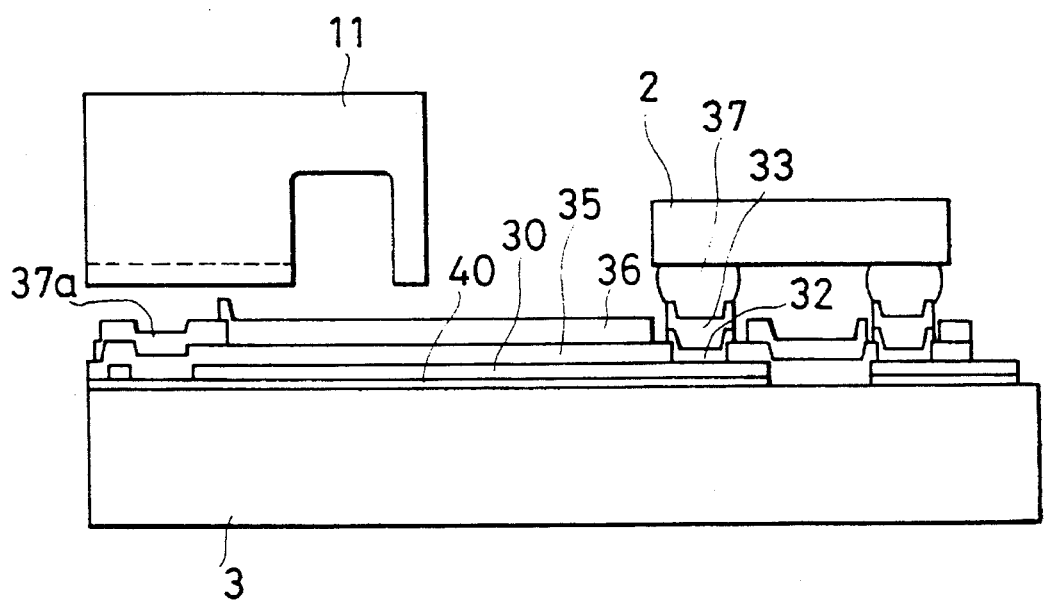
FIG. 9 is a cross section of the ink jet recording head according to the present invention.

Firstly, as shown in FIG. 9, the protective layer 35 is formed of the same material and has the same film thickness as the antioxidation layer such as $SiO_2$, SiN, SiC or the like on the heat generating resistor layer 40, and at the same time the protective layer 36 is formed of the same material and has the same film thickness as the ink resistant layer made of polyimide resin, epoxy resin or the like. This construction makes it easy to form the bump electrode 37 for efficiently connecting the substrate to the electrode (not shown) of a semiconductor device 2 in the same step, and also makes it possible to form an ink jet recording head having such bump electrode.

Figure 2:
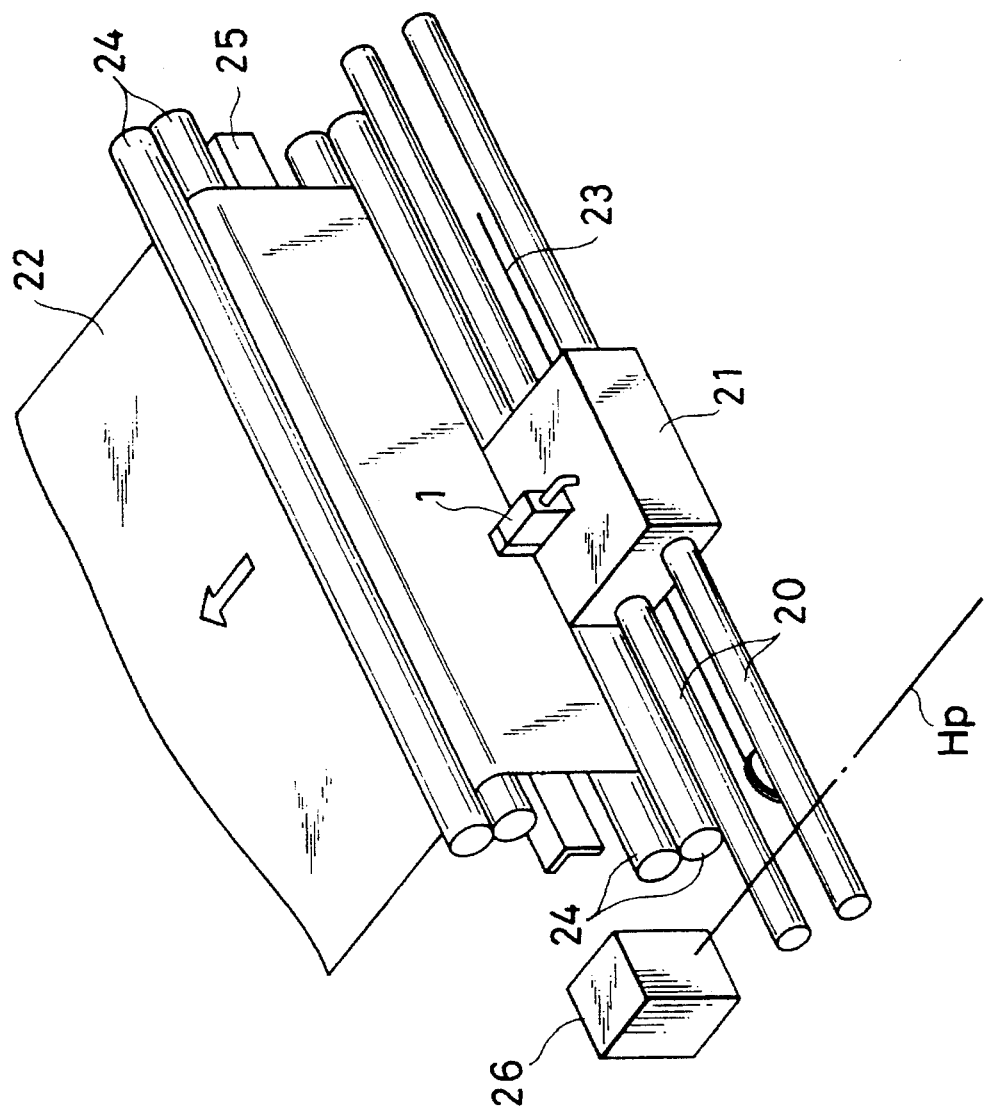
FIG. 2 is a perspective view of the ink jet recording apparatus according to the present invention.
Figure 3A:
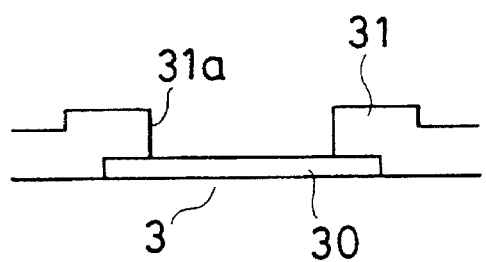
FIGS. 3A to 3E are cross sections illustrating the production procedures of a bump electrode in the conventional thin film wiring substrate.
Figure 3B:
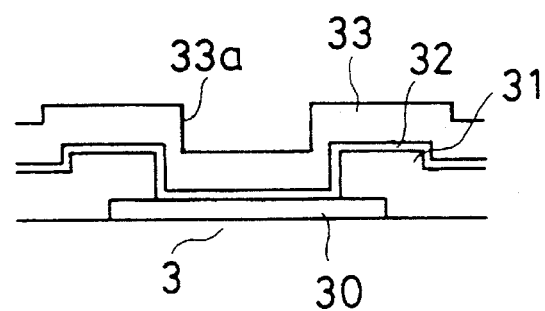
Figure 3C:
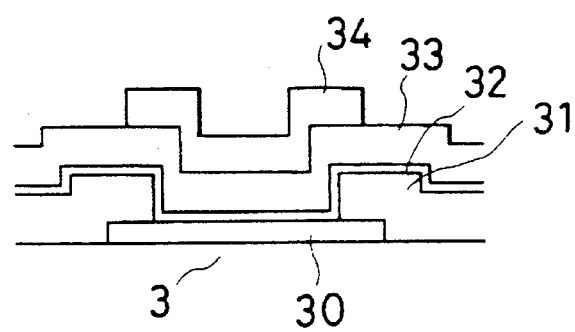
Figure 3D:
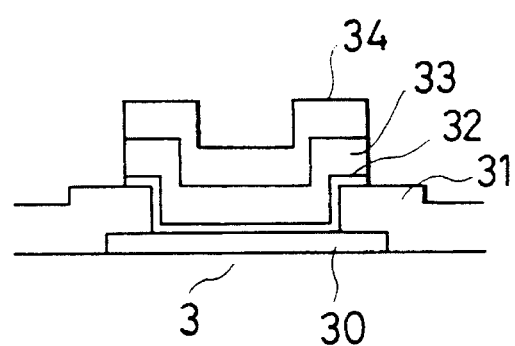
Figure 3E:
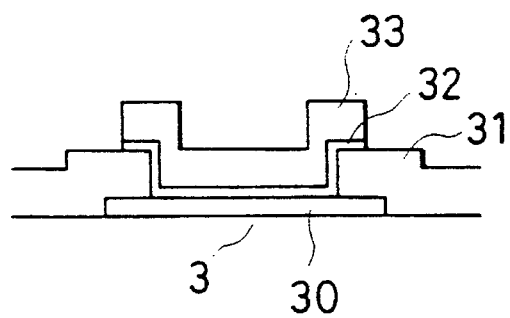
Figure 4A:
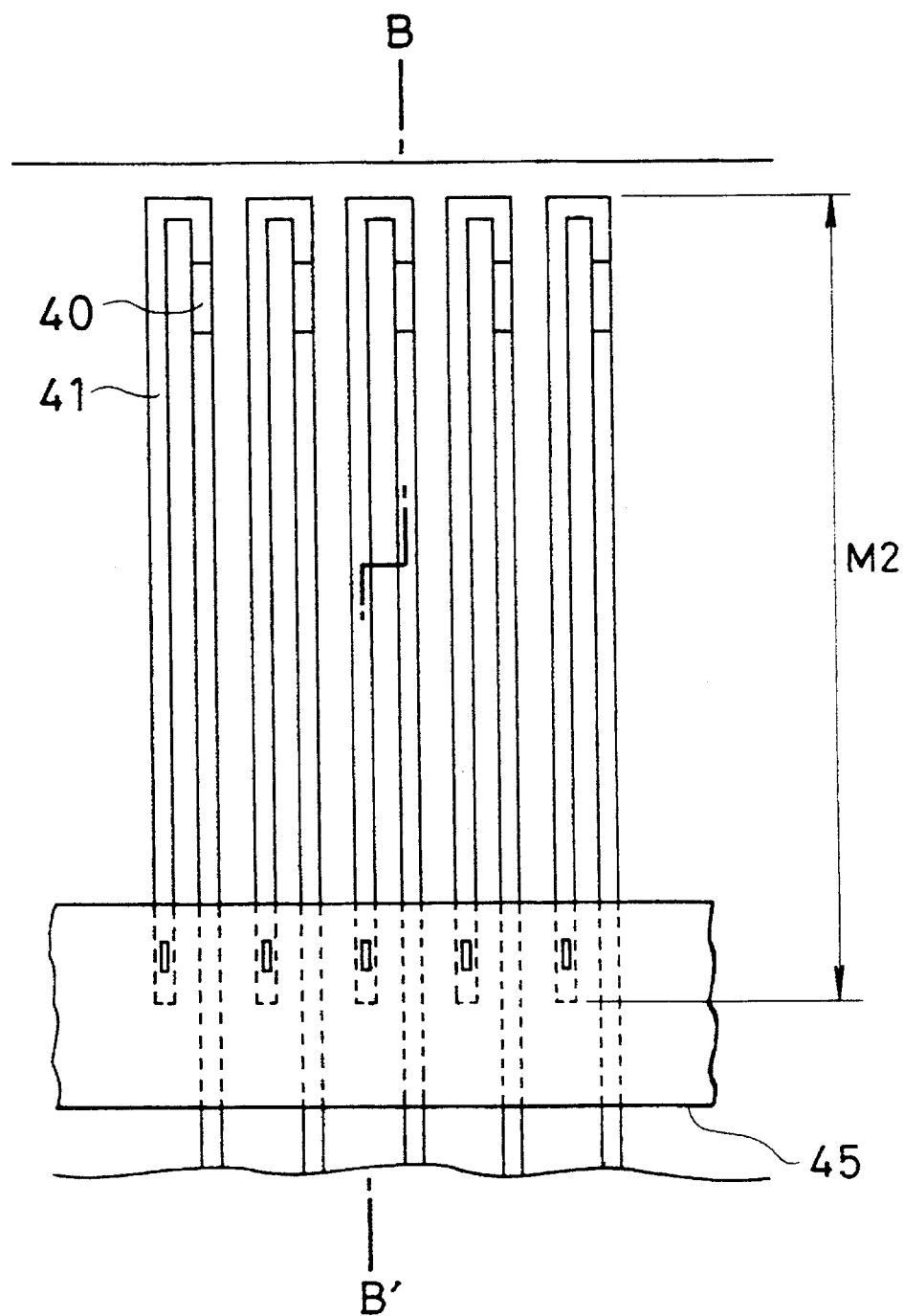
FIG. 4A is a schematic plan view illustrating the conventional recording head.
Figure 4B:
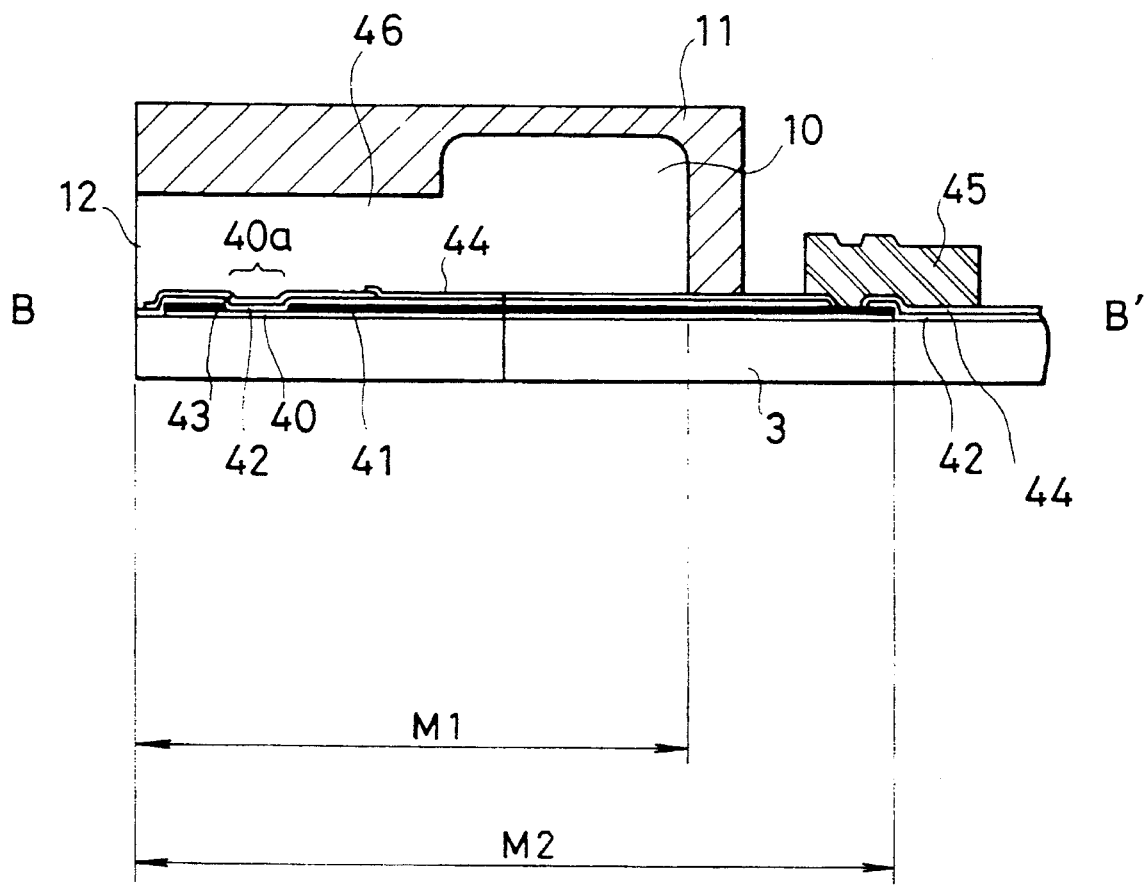
FIG. 4B is a cross section of the conventional recording head along the line B-B' in FIG. 4A.

Using the substrate as described above, a recording head as shown in FIG. 1 can be constructed. Further, a recording apparatus as shown in FIG. 2 can be constructed using such recording head.

According to above embodiments, upon coating the photoresist for patterning of the bump electrode, even if the photoresist layer is coated by roll coating method having a high-productivity but not a better coating performance, there is no coating area being impossible to coat.

In these embodiments, because the protective layer for the Al electrode is laminated in at least two layers, the number of defects such as pin-holes in the protective layer is negligibly small and it is now unnecessary to increase the thickness of the coating film excessively as has been required in protective layer of a single construction conventionally used, resulting in that the film thickness can be made smaller than ever, which decreases cost of materials and prevents curling or other undesirable phenomena of the substrate which could otherwise occur due to lamination of the substrate material with different kinds of materials.

In these embodiments, furthermore, as shown in FIG. 9, one layer out of the two protective layers may be formed as a layer having low-pattern density and low-accuracy of pattern. Thus, in this case, one layer out of the two protective layers may be formed by low-cost patterning method such as screen printing method.

Based on Embodiments 1 and 2 and with reference mainly to FIG. 9, concrete examples will be described hereafter.

EXAMPLE

On the substrate plate 3 made of a single crystal of Si having on its surface an $SiO_2$ film (film thickness: 2.75 mm) formed by thermal oxidation was formed an $HfB_2$ layer (layer thickness: 1,000 Å) functioning as the heat generating resistor layer 4 by sputtering in a vacuum chamber using $HfB_2$ (purity: 99.9% or higher) as a target. Conditions for the sputtering were as follows.

Sputtering Conditions

Target area: 8 inch f

High frequency power: 1,500 W.

Temperature at which substrate plate is set: 100° C.

Film forming time: 20 minutes

Base pressure: $1 \times 10^{-5}$ Pa or lower

Sputtering gas: argon

Sputtering gas pressure: 0.5 Pa

Then, the target was changed to Ti (purity: 99.9% or higher) and sputtering was carried out under the same conditions as above excepting the following:

Film forming time: 1 hour to form a Ti layer (layer thickness: 50 Å, not shown) serving as a contact layer.

Further, the target was changed to Al (purity: 9.9 % or higher) and sputtering was carried out under the same conditions as above excepting the following:

High frequency power: 5,000 W

Film forming time: 6 minutes to form an Al layer (layer thickness: 4,500 Å) serving as the electrode 30.

Subsequently, patterning was performed by lithography as described below relative to the lamination of the $HfB_2$ layer with the Ti layer and to the Al layer. Firstly, a photoresist (trade name: OFPR800, produced by Tokyo Oka Co., Ltd.) was coated as a layer (layer thickness: 1.3 mm) on the Al layer, which was exposed to light, developed and baked by conventional methods. Then, etching of the Al layer was carried out using a mixture of acetic acid, phosphoric acid and nitric acid (acetic acid 9%, phosphoric acid: 73% and nitric acid: 2%) as an etching solution. Thereafter, etching of the lamination of the $HfB_2$ layer and the Ti layer was carried out by reactive etching in a vacuum chamber to remove the photoresist, thus completing the patterning. The reactive etching was performed under the following conditions:

Conditions of reactive etching

Etching power: 450 W

Etching time: 5 minutes

Base pressure : $1 \times 10^{-3}$ Pa

Gas species: $BCl_3$

Gas pressure: 3 Pa

Then, an $SiO_2$ layer (layer thickness: 1.3 mm) serving as the protective layer 35 having mainly an antioxidation function was formed by sputtering in a vacuum chamber using $SiO_2$ (purity: 99.9% or higher) as a target. Conditions of the sputtering were as follows:

Sputtering Conditions

Target area: 8 inch f

High frequency power: 2,000 W.

Temperature at which substrate plate is set: 100°C.

Film forming time: 90 minutes

Base pressure: $8 \times 10^{-4}$ Pa or lower

Sputtering gas: argon

Sputtering gas pressure: 0.5 Pa

Further, the target was changed to Ta (purity: 99.9% or higher) and sputtering was carried out under the same conditions as $SiO_2$ excepting the following:

High frequency power: 1,500 W

Film forming time: 30 minutes to form a Ta layer (layer thickness: 0.5 mm) serving as the protective layer 37a having mainly an anti-cavitation function.

Subsequently, patterning was performed by lithography as described below relative to the $SiO_2$ layer and the Ta layer. Firstly, the same photoresist as described above was coated as a layer (layer thickness: 1.3 mm) on the Al layer, which was exposed to light, developed and baked by conventional methods. Then, chemical etching of the Ta layer was carried out to form a pattern of the protective layer 37a, followed by removal of the photoresist. Conditions of the chemical etching were as follows:

Conditions of chemical etching

Etching power: 600 W

Etching time: 8 minutes

Base pressure : 1 Pa

Gas species: $CF_4$ ( flow rate: 200 sccm)

Gas species: $O_2$ (flow rate: 100 sccm)

Gas pressure: 15 Pa

Thereafter, the same photoresist as described above was coated as a layer (layer thickness: 2.6 mm), which was exposed to light, developed and baked by conventional methods. Then, reactive etching of the $SiO_2$ layer was carried out to form a pattern of the protective layer 35 including a through hole, followed by removal of the photoresist. Conditions of the reactive etching were as follows:

Conditions of reactive etching

Etching power: 950 W

Etching time: 33 minutes

Base pressure : $5 \times 10^{-3}$ Pa

Gas species:

$CHF_3$ ( flow rate: 16 sccm)

$C_2F_5$ (flow rate: 24 sccm)

$O_2$ ( flow rate: 5 sccm)

Gas pressure: 2 Pa

Next, a polyimide (trade name: UR3100, produced by Toray Corporation) was coated by a roll coating method to form a pattern of 2.5 mm in thickness, which was pre-baked, exposed to light, developed and post-cured by conventional methods to complete formation of the protective layer 36.

Subsequently, the target was changed to Ti (purity: 99.9% or higher) and sputtering was carried out under the same conditions as described above excepting the following:

Film forming time: 10 minutes to form a Ti layer (layer thickness: 500 Å) serving as the barrier metal layer 32.

Further, the target was changed to Cu (purity: 99.9% or higher) and sputtering was carried out under the same conditions as the Ti formation excepting the following:

High frequency power: 5,000 W

Film forming time: 4 minutes to form a Cu layer (layer thickness: 3,000 Å) serving as the solder connecting layer 33.

Subsequently, patterning of lamination between the Ti layer and the Cu layer was carried out by lithography as described below. Firstly, the same photoresist as described above was coated as a layer (layer thickness: 1.3 mm) by a roll coating method, which layer was exposed to light, developed and baked by conventional methods. Then, etching of the Cu layer was carried out for 30 seconds using 10% by weight ammonium persulfate solution as an etching solution to form the solder connecting layer 33. Next, etching of the Ti layer was carried out for. 20 seconds using 2% by weight hydrofluoric acid solution as an etching solution to form the barrier metal layer 32, and thereafter the photoresist was removed.

On the thus-formed substrate for an ink jet head was arranged the plate 11 made of glass and provided with a concave portion serving as a wall of the passage for ink communicated to discharge portions.

On the other hand, a wiring electrode (not shown) provided on the surface of the driving substrate 2 with a semiconductor cable was connected to the solder connecting layer 33 through the bump electrode 37 to form an ink jet head as shown in FIG. 9. The ink jet head had several thousands of discharge portions each corresponding to a plurality of heat generating portions.

The ink jet head was fitted to the main body of an ink jet apparatus and recording was performed with actually discharging ink. As a result, it was confirmed that the ink jet head obtained in this example was very excellent both from a point of view of recording quality and of durability.

Embodiment 3

To cope with the problem involved in the electro-thermal converting element portion explained in the description of the prior art, the following countermeasure has been found. More specifically, a wiring portion for connection was provided between the electrode portion and the common electrode, and in the wiring portion, protective layers are formed above and below this electroconductive layer using an organic material, making it possible to hold the connecting portion between the electrode and the wiring portion within the common liquid chamber and thus enabling shortening of the length of the continuous electrode portion greatly in accordance with reduction in space realized by the above-described construction.

This construction decreases the occurrence of short circuit and disconnection in the wiring of the electrode portion, thus maintaining adhesion between the electroconductive layer and the protective layer in good conditions for a prolonged period of time.

Figure 10A:
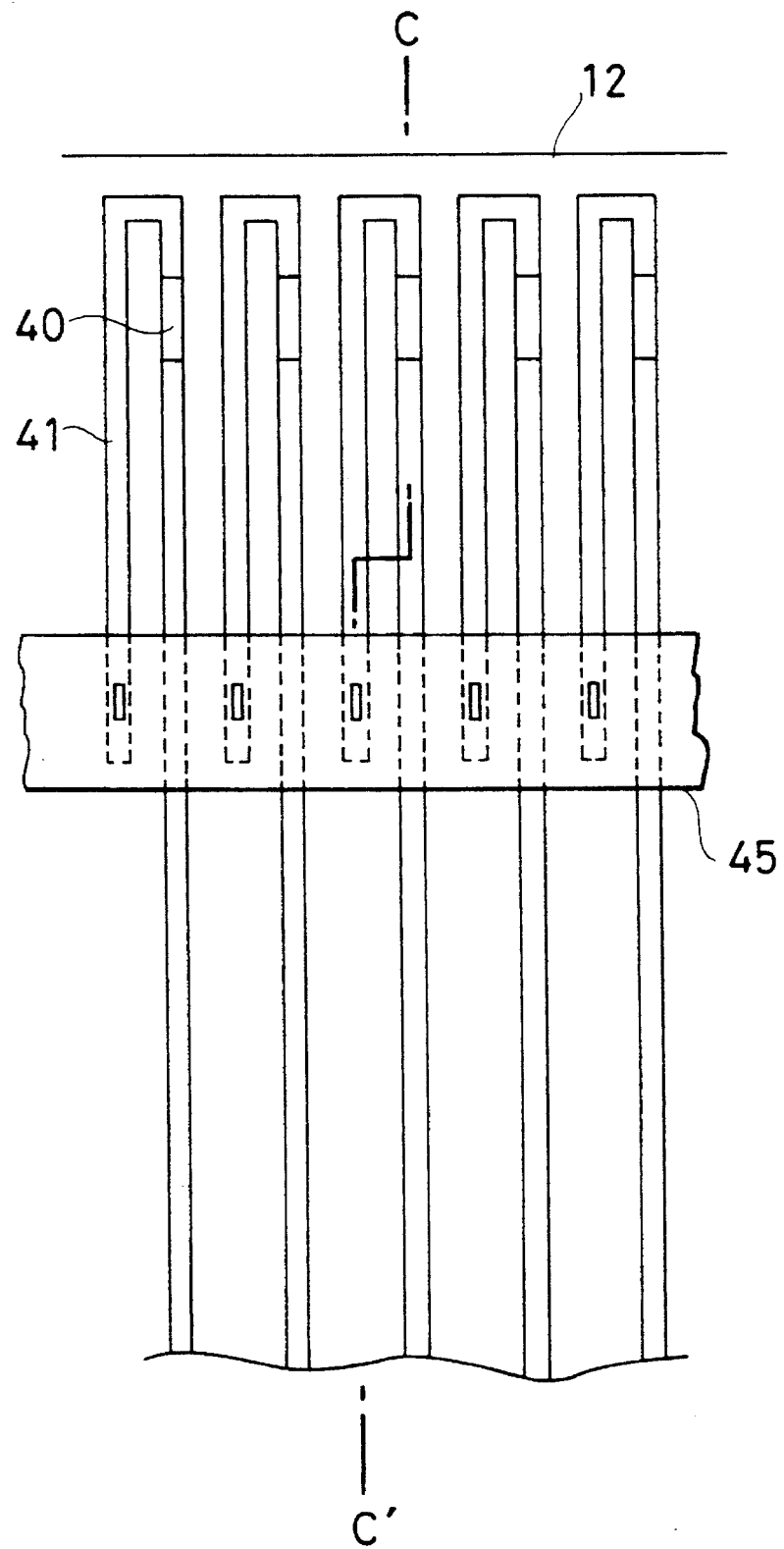
FIG. 10A is a schematic plan view of the substrate of the recording head according to the present invention.
Figure 10B:
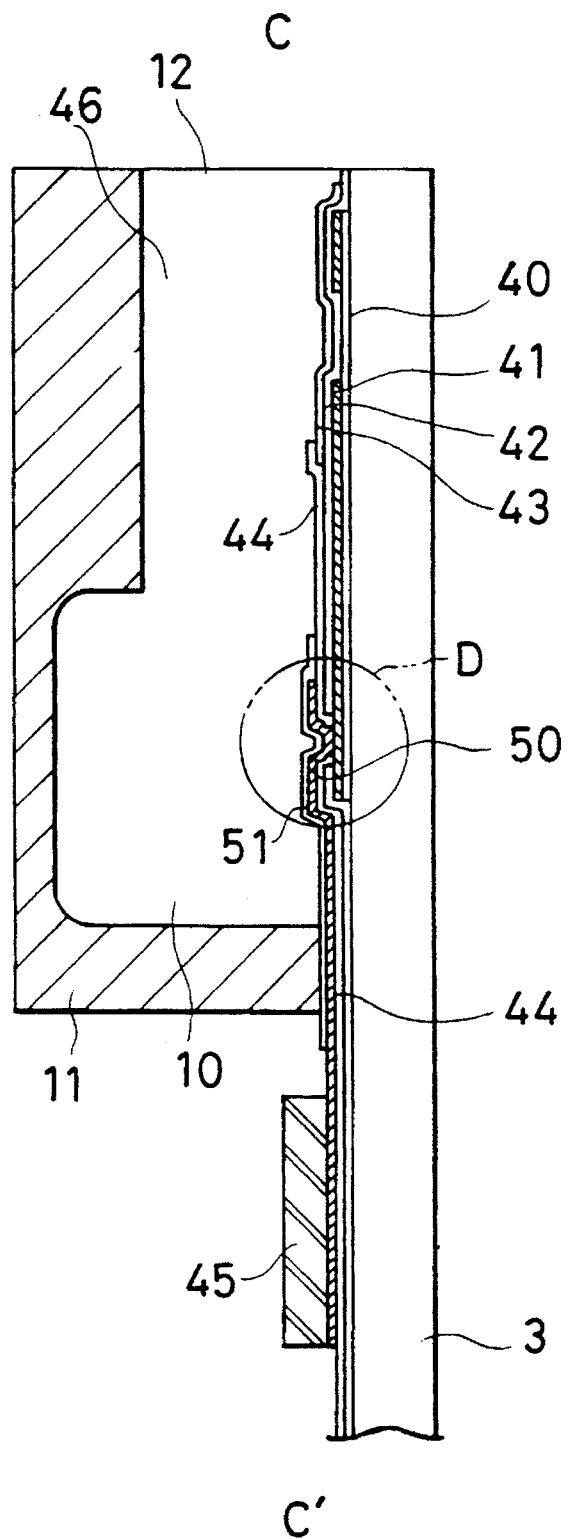
FIG. 10B is a cross section of the substrate along the line C-C' in FIG. 10A.

FIG. 10A is a schematic plan view of the substrate of recording head based on the above finding of the present inventors. FIG. 10B is a schematic cross section of the substrate shown in FIG. 10A along the line C-C'.

Firstly, a first layer is formed on the substrate plate 3 by providing thereon an $HfB_2$ layer serving as the heat generating resistor layer 40 and an Al layer serving as the electrode 41, both used for forming an electro-thermal converting element. An SiO2 layer serving as the anti-oxidation film 42 of the electro-thermal converting element and a Ta layer serving as anti-cavitation film 43 are formed. As the ink resistant layer 44, a photosensitive polyimide is coated. A wiring 50 made of Al is provided as a second layer (connection wiring portion).

As the protective layer 42 for the second layer 50 is coated an organic material, for example, a photosensitive polyimide. The common electrode 45 is made of Cu of a high electroconductivity by plating. In the same manner as the recording head described above, the plate 11 is bonded on the substrate, and the wiring is connected electrically to construct a liquid jet recording head.

Figure 10C:
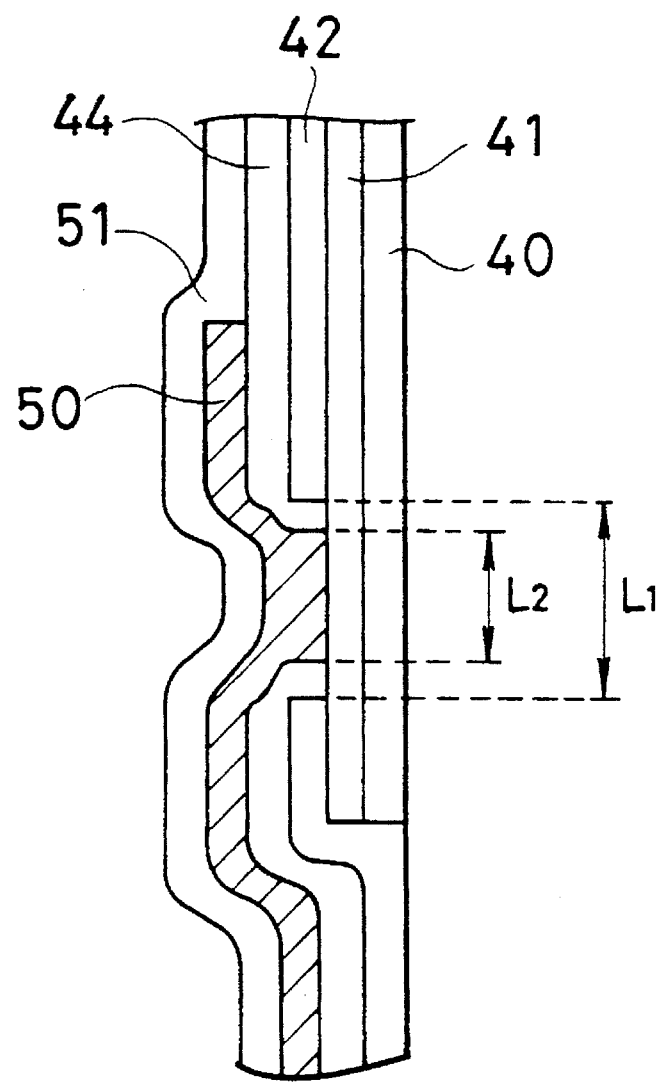
FIG. 10C is a partial enlarged view of the substrate shown in FIG. 10B.

Here, the structure of through hole of a multilayer wiring structure is as shown in FIG. 10C. The $SiO_2$ layer 42 which is an interlayer insulation layer and the photosensitive polyimide layer 44 have openings having lengths of $L_1$ and $L_2$, respectively, where $L_1>L_2$, and the second electroconductive layer 50 is bonded to only the photosensitive polyimide 44 and the first electroconductive layer (electrode) 41.

However, although the above-described construction is improved more or less, the second electroconductive layer 50 is bonded to only the photosensitive polyimide 44 which is an organic material out of the underlying interlayer insulating layers. Generally, bonding strength between organic materials and metals is not so strong and this is no problem in initial stages. But, when recording is continued under repeatedly applying a large amount of electric current to the electro-thermal converting element so that thermal energy high enough to enable discharging of a liquid can be generated, the bonding between the organic material and the electroconductive layer is deteriorated to decrease ink resistance, resulting in that there is a fear that corrosion occurs in the electroconductive layer and the electrode.

This embodiment is to achieve further improvement with respect to the above-described problems.

According to a preferred embodiment of the present invention, in the case where a layer structure consisting of a first insulating layer made of an inorganic material and a second insulating layer made of an organic material is used as an interlayer insulating layer between at least two electroconductive layers in view of ink resistance, the opening of the through hole in the second insulating layer is made larger than the opening of the through hole in the first insulating layer in at least a part there of so that a portion which contacts the electroconductive layer directly and bonded thereto can be provided not only in the second insulating layer made of an organic material but also in the first insulating layer made of an inorganic material. This construction increases adhesion between the second electroconductive layer and each layer to improve durability and reliability of the wiring portion. As the material for forming the first and second electroconductive layers, there can be used Al, Cu and the like. For the first insulating layer, there can be used $SiO_2$, SiN, SiC, $Ta_2O_5$, AlN, $Al_2O_3$, and the like while photosensitive polyimide, epoxy resin, acrylic resin, silicone resin and the like are used for the second insulating layer.

Figure 11:
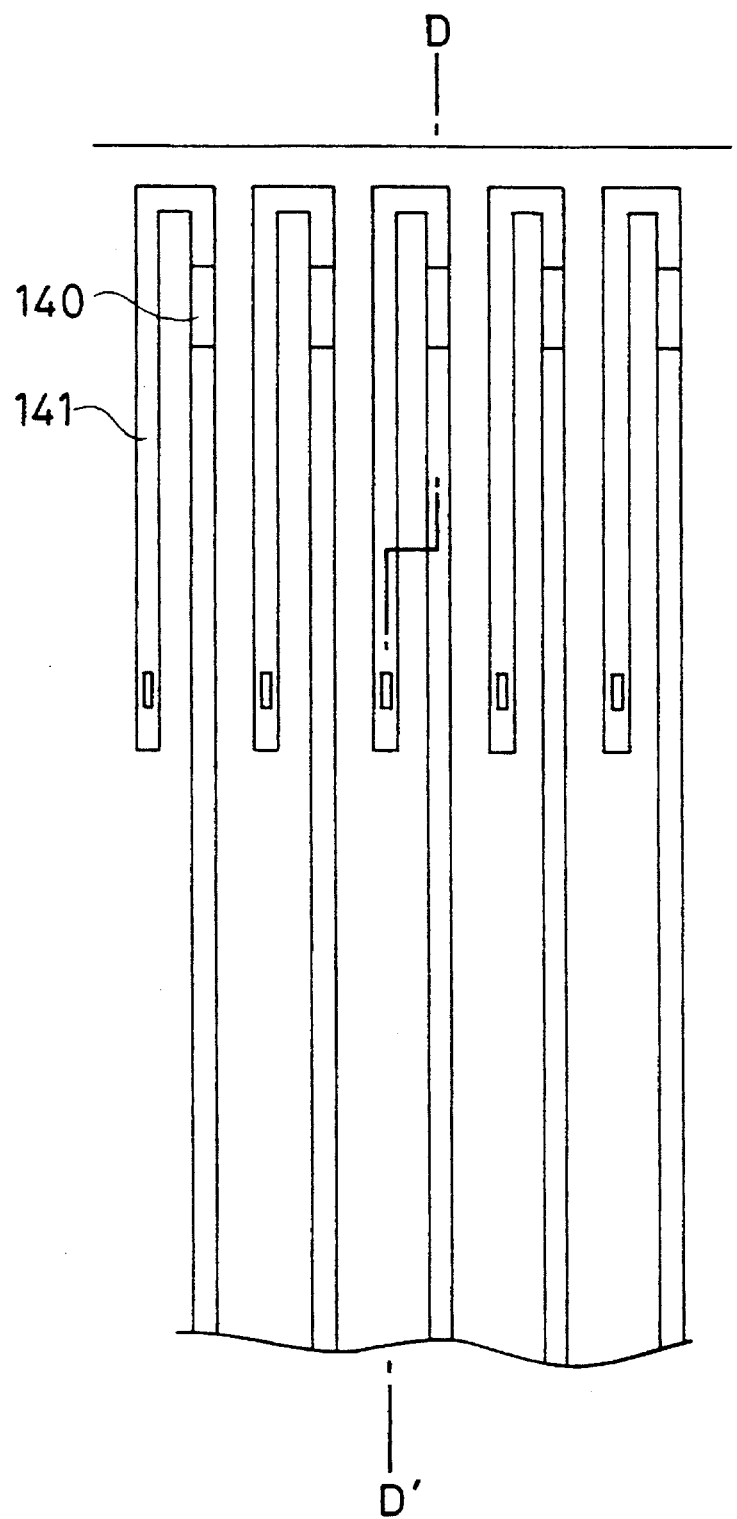
FIG. 11 is a schematic plan view of the heat generating substrate of the recording head according to an embodiment of the present invention.

FIG. 11 is a schematic plan view of the heat generating substrate for the recording head according to the third embodiment of the present invention.

Figure 12:
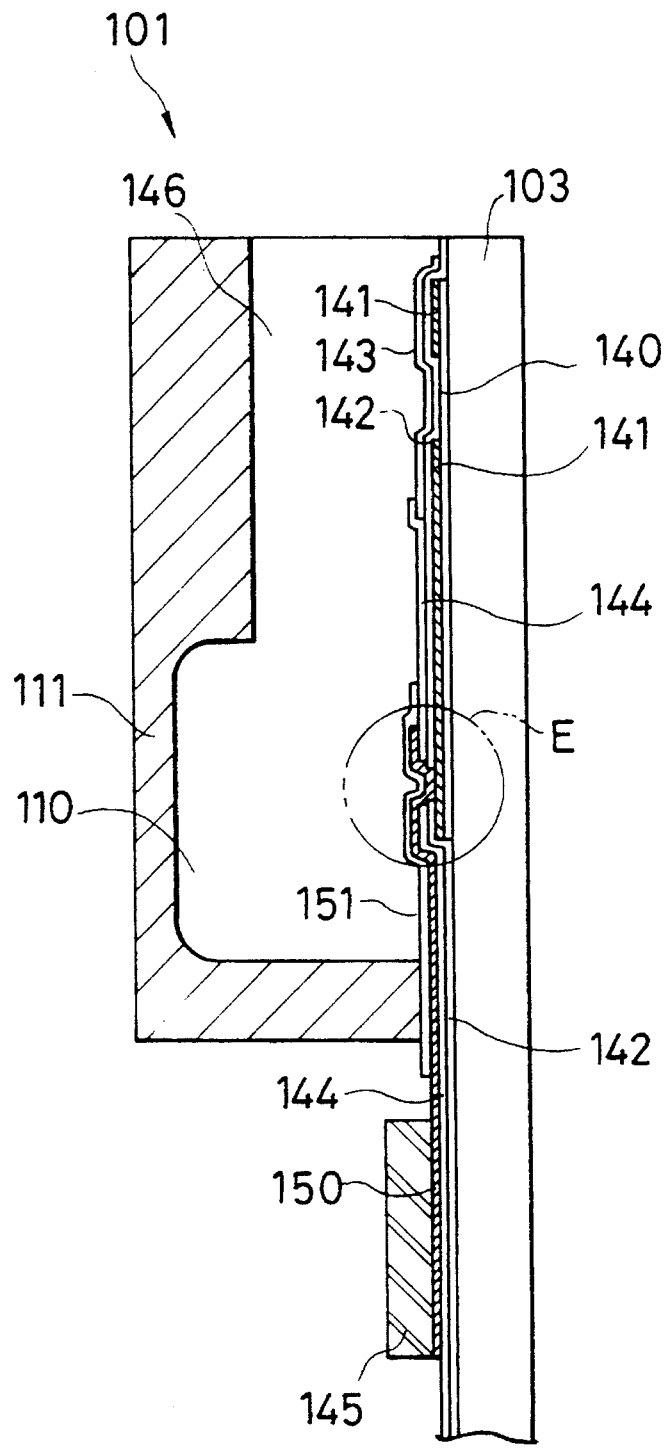
FIG. 12 is a cross section of the substrate along the line D-D' in FIG. 11.
Figure 13:
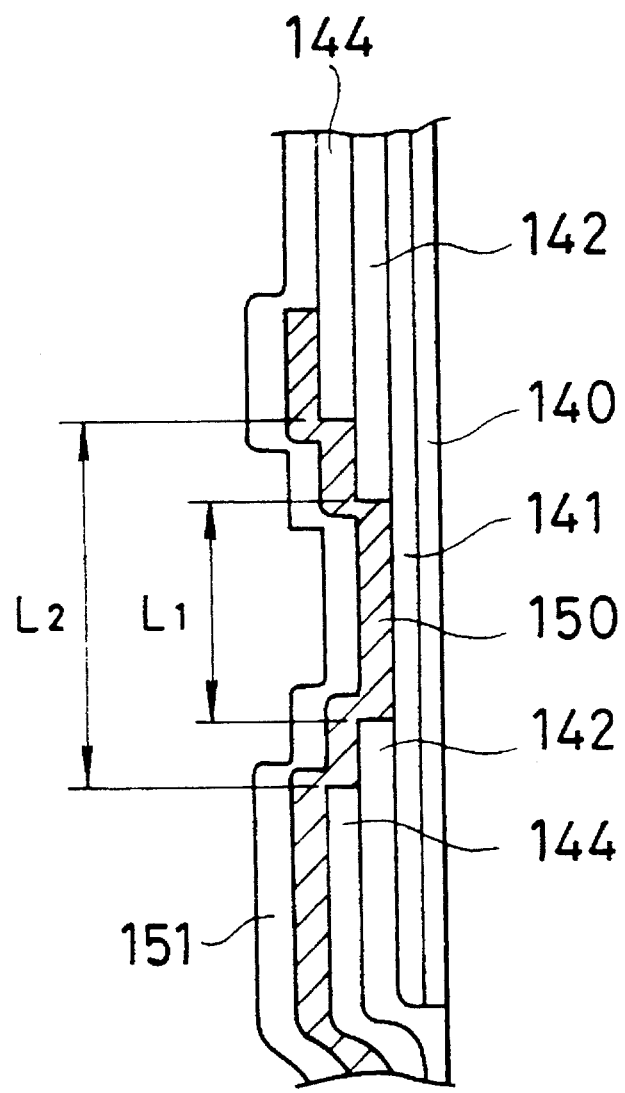
FIG. 13 is a partial enlarged view of the contact portion E of the wiring in FIG. 12.

FIG. 12 is a schematic cross section of the substrate shown in FIG. 11 along the line D-D'. FIG. 13 is a partial enlarged view of the contact portion B of the wiring shown in FIG. 12, which illustrates well a characteristic feature of the present invention. First, the production method of a recording head 101 will be explained below.

On a substrate plate 103 made of a single crystal of silicon are formed an $HfB_2$ layer 140 as a heat generating resistor layer for forming an electro-thermal converting element and an Al layer 141 by sputtering and deposition, respectively, and patterned by etching to form a first electroconductive layer.

Next, an $SiO_2$ layer as an anti-oxidation protective layer for the electro-thermal converting element is formed thereon by sputtering or a CVD method and further a Ta layer 143 as a protective layer having anti-cavitation property is formed. On this occasion, it is sufficient that the Ta layer 143 is provided in a heat generating portion where bubbles are formed.

Then, a photosensitive polyimide 144 is coated to form an ink resistant protective layer and patterned. Thereon is formed an Al layer 150 as a second electroconductive layer by deposition, followed by patterning. Further, a protective layer 151 made of a photosensitive polyimide is coated thereon, and then patterned.

In order to increase the conductivity to enable application of a large amount of electric current, Cu is plated thereon to a thickness on the order of 10 mm to form a common electrode 145. Thus, the heat generating substrate for the recording head 101 is formed.

Here, the $SiO_2$ layer 142 as an inorganic protective layer and the photosensitive polyimide 144 as an organic protective layer beneath the second electroconductive layer (here designated by reference numeral 150) serve as interlayer insulating layers.

Thereafter, a plate 111 for forming a common liquid chamber 110 and liquid paths 146 is bonded with an adhesive or otherwise to construct a recording head.

The structure of the through hole portion of the multilayer wiring is as shown in FIG. 13. $L_1$ designates the length of a side of the opening of the $SiO_2$ layer 142, and $L_2$ is the length of a side of the opening of the photosensitive polyimide 144. Here, the openings, respectively, are rectangular and the longer sides are defined $L_1$ and $L_2$, respectively. Of course, it is desirable that shorter sides be in a similar relationship.

According to this embodiment, $L_1$ and $L_2$ meets the relationship $L_1<L_2$ under which condition at least a part of the second electroconductive layer 150 is in a direct contact not only with the photosensitive polyimide 144 but also with the $SiO_2$ layer 142 and bonded thereto.

This construction as long term durability and discharge stability, thus extremely increasing reliability even when it is used for a recording head utilizing thermal energy.

Further investigation by the present inventors on the relationship between $L_1$ and $L_2$ has revealed that favorable results can be obtained when L2-L1 is set up to preferably be 2 mm or more, and more preferably 1 mm or more.

Further, in view of the problem involved in step coverage capability of the second electroconductive layer, it is desirable that the thickness of the inorganic insulating layer be 0.1 to 10 mm, preferably 0.5 to 3 mm, and the thickness of the organic insulating layer be 0.5 to 3 mm, preferably 1 to 5 mm.

Embodiment 4

The laminate structure including a bump electrode as described in Embodiment 1 is formed so that the bump electrode is positioned on the corresponding substrate plate in the common ink chamber. Thereafter, a protective layer is formed on the bump electrode using an organic material as in Embodiment 3 to make a substrate for the ink jet head according to this embodiment.

On the substrate for ink jet head thus prepared are formed walls of ink paths communicated to discharge portions using a photosensitive resin, and a glass plate is provided thereon to make an ink jet recording head.

As described earlier, the above-described wiring substrate, recording head and recording apparatus of the present invention are desirably applied to apparatuses of types utilizing basic operational principles disclosed, for example, in U.S. Pat. Nos. 4,723,129 and 4,749,796. The principle is applicable to a so-called on-demand type recording system and a continuous type recording system. Particularly it is suitable for the on-demand type because the principle is such that at least one driving signal is applied to an electro-thermal converting element disposed on liquid (ink) retaining sheet or ink passage, the driving signal being enough to provide such a quick temperature rise beyond a departure from nucleation boiling point, by which the thermal energy is provided by the electro-thermal converting element to produce film boiling on the heating portion of the recording head, whereby a bubble can be formed in the liquid (ink) corresponding to each of the driving signals. By the development and collapse of the bubble, the liquid (ink) is discharged through a discharge portion to produce at least one droplet. The driving signal is preferably in the form of a pulse because the development and collapse of the bubble can be effected instantaneously, and therefore, the liquid (ink) is discharged with quick response. The driving signal in the form of the pulse is preferably such as disclosed in U.S. Pat. Nos. 4,463,359 and 4,345,262. In addition, the temperature increasing rate of the heating surface is preferably such as disclosed in U.S. Pat. No. 4,313,124.

The structure of the recording head may be as shown in U.S. Pat. Nos. 4,558,333 and 4,459,600 wherein the heating portion is disposed at a bent portion in addition to the structure of the combination of the discharging portion, liquid passage and the above-described patents. In addition, the present invention is applicable to the structure disclosed in Japanese Patent Application Laying-Open No. 123670/1984 wherein a common slit is used as a discharge portion for plural electro-thermal converting elements, and to the structure disclosed in Japanese Patent Application Laying-Open No. 138461/1984 wherein an opening for absorbing pressure waves of the thermal energy is formed corresponding to the discharge portion. This is because the present invention is effective to perform the recording operation with certainty and at high efficiency irrespective of the type of the recording head.

Further, the present invention is effectively applicable to a so-called full-line type recording head having a length corresponding to the maximum recording width and having one thousand or more discharging portions. Such a recording head may comprise a single recording head integrally formed and a plurality of recording heads combined to cover the entire width.

In addition, the present invention is applicable to a serial type recording head wherein the recording head is fixed on the main assembly, to a replaceable chip type recording head which is connected electrically with the main apparatus and can be supplied with the ink by being mounted in the main assembly, or to a cartridge type recording head having an integral ink container.

The provision of the recovery means and the auxiliary means for the preliminary operation are preferred because they can further stabilize the effect of the present invention. As for such means, there are capping means for the recording head, cleaning means therefor, pressing or suction means, preliminary heating means by the discharging electrothermal converting element and additional heating element and means for preliminary discharge not for the recording operation, which can stabilize the recording operation.

As regards the kind and the number of the recording heads mounted, a single head corresponding to a single color ink may be equipped, or a plurality of heads corresponding, respectively, to a plurality of ink materials having different recording colors or densities may be equipped. The present invention is effectively applicable to an apparatus having at least one of a monochromatic mode solely with main color such as black and a multi-color mode with different color ink materials or a full-color mode by color mixture. The multi-color or full-color mode may be realized by a single recording head unit having a plurality of heads formed integrally or by a combination of a plurality of recording heads.

Furthermore, the form of the ink jet recording apparatus to which the present invention is applicable may be the one which can be used as an image output terminal for information processors such as computers and the like and in addition thereto a copying apparatus combined with a reader or the like as well as a facsimile apparatus having transmission and receiving functions.

Still further, in the foregoing embodiment, the ink has been liquid. It may, however, be an ink material solidified at room temperature or below and liquefied at room temperature. Since in the ink jet recording system, the ink is controlled within the temperature not less than 30° C. and not more than 70° C. to stabilize the viscosity of the ink to provide the stabilized discharging, in usual recording apparatus of this type, the ink is such that it is liquid within the temperature range when the recording signal is applied. In addition, the temperature rise due to the thermal energy is positively prevented by consuming it for the state change of the ink from the solid state to the liquid state, or the ink material that is solidified when it is left unused is used to prevent the evaporation of the ink. In either of the cases, the application of the recording signal producing thermal energy, the ink may be liquefied, and the liquefied ink may be discharged. The ink may start to be solidified at the time when it reaches the recording material. The present invention is applicable to such an ink material as is liquefied by the application of the thermal energy. Such an ink material may be retained as a liquid or solid material in through holes or recesses formed in a porous sheet as disclosed in Japanese Patent Application Laying-Open No. 56847/1979 and Japanese Patent Application Laying-Open No. 71260/1985. The sheet is faced to the electro-thermal converting elements. The most effective one for the ink materials described above is the film boiling system.

The invention has been described in detail with respect to embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. An ink jet recording device comprising:

a substrate;

a plurality of electro-thermal converting elements, disposed on said substrate, each said element having a heat generating resistor and a pair of electrodes electrically connected to that said heat generating resistor;

a protective layer formed on said substrate and covering said electro-thermal converting elements, said protective layer comprising a first insulating layer of an inorganic material, a second insulating layer of an organic material which covers said first insulating layer, and a third insulating layer of an organic material which covers said second insulating layer;

a plurality of ink discharge orifices for discharging an ink fed thereto;

a liquid chamber in fluid communication with said ink discharge orifices through a plurality of ink flowing paths, and holding the ink which is fed to said ink discharge orifices;

driving signal generating means for generating a driving signal for driving said electro-thermal converting elements, a wiring electrode for applying said driving signal to at least one of said electro-thermal converting elements, wherein said wiring electrode is formed between said second insulating layer and said third insulating layer, and said wiring electrode is electrically connected to one of the pair of electrodes via a through-hole formed in said first insulating layer and a second through-hole formed in said second insulating layer, in said liquid chamber, and said second through-hole in said second insulating layer is larger than said first through-hole in said first insulating layer.

2. A recording device as in claim 1, wherein said wiring electrode is a common electrode for said plurality of electro-thermal converting elements.

\* \* \* \* \*

UNITED STATES PATENT AND TRADEMARK OFFICE
CERTIFICATE OF CORRECTION

PATENT NO. : 5,576,748

DATED : November 19, 1996

INVENTOR(S): HIDEO TAMURA

It is certified that error appears in the above-identified patent and that said Letters Patent is hereby corrected as shown below:

ON THE TITLE PAGE:

[56] REFERENCES CITED

Foreign Patent Documents,
        "1187949" should read --1-187949--
        "1191451" should read --1-191451--.

COLUMN 1

Line 66, "ACPU" should read --a CPU--.

COLUMN 2

Line 20, "product ion" should read --production--.

COLUMN 3

Line 3, "HfB2" should read --$HfB_2$--.
    Line 27, "spray" should read --jet--.
    Line 59, "view" should read --a view--.

COLUMN 4

Line 60, "DESCRIPTION DESCRIPTION" should read
      --DESCRIPTION--.

COLUMN 5

Line 23, "therefore," should read --Therefore,--.

UNITED STATES PATENT AND TRADEMARK OFFICE
CERTIFICATE OF CORRECTION

PATENT NO. : 5,576,748

DATED : November 19, 1996

INVENTOR(S): HIDEO TAMURA

It is certified that error appears in the above-identified patent and that said Letters Patent is hereby corrected as shown below:

COLUMN 6

Line 51, "above" should read --the above--.

COLUMN 7

Line 5, "pattering" should read --patterning--.
    Line 33, "9.9%" should read --99.9%--.

COLUMN 9

Line 8, "for." should read --for--.
    Line 56, "SiO2" should read --$SiO_2$--.

COLUMN 10

Line 34, "there of" should read --thereof--.
    Line 55, "First," should read --¶ First,--.

COLUMN 11

Line 1, "On" should read --On--.
    Line 29, "defined $L_1$" should read --defined as $L_1$--.
    Line 37, "as" should read --improves--.

COLUMN 13

Line 18, "embodiment,the" should read --embodiment, the--.

UNITED STATES PATENT AND TRADEMARK OFFICE
CERTIFICATE OF CORRECTION

PATENT NO.  : 5,576,748

DATED       : November 19, 1996

INVENTOR(S) : HIDEO TAMURA

Page 3 of 3

It is certified that error appears in the above-identified patent and that said Letters Patent is hereby corrected as shown below:

<u>COLUMN 14</u>

Line 2, "invention," should read --intention,--.

Signed and Sealed this

Fifth Day of August, 1997

Attest:

BRUCE LEHMAN

*Attesting Officer*  *Commissioner of Patents and Trademarks*